(12) United States Patent
Kim et al.

(10) Patent No.: US 9,996,001 B2
(45) Date of Patent: Jun. 12, 2018

(54) RETICLE AND EXPOSURE APPARATUS INCLUDING THE SAME

(71) Applicant: Samsung Electronics Co., Ltd., Suwon-si, Gyeonggi-do (KR)

(72) Inventors: Insung Kim, Seongnam-si (KR); SeongSue Kim, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days. days.

(21) Appl. No.: 15/262,447

(22) Filed: Sep. 12, 2016

(65) Prior Publication Data
US 2017/0131638 A1    May 11, 2017

(30) Foreign Application Priority Data
Nov. 9, 2015   (KR) .................. 10-2015-0156920

(51) Int. Cl.
*G03B 27/62*   (2006.01)
*G03F 1/62*    (2012.01)
*G03F 7/20*    (2006.01)

(52) U.S. Cl.
CPC ............ *G03F 1/62* (2013.01); *G03F 7/70708* (2013.01); *G03F 7/70916* (2013.01); *G03F 7/70933* (2013.01)

(58) Field of Classification Search
CPC ...... G03F 1/20; G03F 7/70191; G03F 1/0084; G03F 1/70; G03F 1/76; G03F 7/20; G03F 7/2063

See application file for complete search history.

(56) References Cited

U.S. PATENT DOCUMENTS

| | | | |
|---|---|---|---|
| 6,499,935 B1 * | 12/2002 | Hirakawa | G03F 1/66 414/741 |
| 6,753,941 B2 | 6/2004 | Visser | |
| 6,803,161 B2 | 10/2004 | Shirasaki | |
| 6,862,817 B1 * | 3/2005 | Lenox | G03F 7/707 33/613 |
| 7,030,959 B2 | 4/2006 | Sogard | |
| 7,655,363 B2 | 2/2010 | Dai | |
| 7,723,704 B2 | 5/2010 | Wood, II et al. | |
| 7,767,985 B2 | 8/2010 | Okoroanyanwu et al. | |
| 8,535,545 B2 | 9/2013 | Kim | |
| 9,140,975 B2 | 9/2015 | Sun et al. | |
| 9,244,368 B2 | 1/2016 | Delgado et al. | |
| 2002/0089656 A1 * | 7/2002 | Guo | G03B 27/62 355/75 |

(Continued)

FOREIGN PATENT DOCUMENTS

| | | |
|---|---|---|
| JP | 5190034 B2 | 4/2013 |
| JP | 5533227 B2 | 6/2014 |

(Continued)

*Primary Examiner* — Deoram Persaud
(74) *Attorney, Agent, or Firm* — Harness, Dickey & Pierce, P.L.C.

(57) ABSTRACT

A reticle including a mask and an edge cover may be provided. The mask may include a mask substrate and mask patterns on the mask substrate. The edge cover may be coupled to an edge of the mask substrate and may include a floating cover part. The floating cover part may be spaced apart from the mask patterns while extending from a sidewall of the mask substrate over the mask patterns.

20 Claims, 7 Drawing Sheets

(56) References Cited

U.S. PATENT DOCUMENTS

| | | | |
|---|---|---|---|
| 2003/0016338 A1* | 1/2003 | Yasuda | G03B 27/52 355/55 |
| 2003/0071979 A1 | 4/2003 | Visser | |
| 2003/0179354 A1* | 9/2003 | Araki | G03B 27/42 355/53 |
| 2003/0207182 A1 | 11/2003 | Shirasaki | |
| 2003/0227605 A1* | 12/2003 | del Puerto | B82Y 10/00 355/51 |
| 2004/0004704 A1* | 1/2004 | Wiseman | G03B 21/62 355/75 |
| 2004/0100624 A1* | 5/2004 | Hagiwara | G03F 7/707 355/72 |
| 2005/0117142 A1* | 6/2005 | Heerens | G03F 7/707 355/75 |
| 2005/0121144 A1* | 6/2005 | Edo | G03F 7/70741 156/345.32 |
| 2006/0017895 A1 | 1/2006 | Sogard | |
| 2007/0024831 A1* | 2/2007 | Hibbs | G03F 7/707 355/53 |
| 2007/0254217 A1 | 11/2007 | Dai | |
| 2008/0024751 A1* | 1/2008 | Hirayanagi | G03F 7/707 355/75 |
| 2008/0113491 A1 | 5/2008 | Wood et al. | |
| 2008/0152873 A1 | 6/2008 | Okoroanyanwu et al. | |
| 2008/0184584 A1 | 8/2008 | Sogard | |
| 2010/0159399 A1* | 6/2010 | Vermeulen | G03B 27/42 430/322 |
| 2011/0032496 A1* | 2/2011 | Shibazaki | G03F 7/707 355/30 |
| 2011/0065278 A1 | 3/2011 | Kim | |
| 2012/0086925 A1 | 4/2012 | Kraus et al. | |
| 2013/0003036 A1 | 1/2013 | Akiyama et al. | |
| 2014/0085618 A1 | 3/2014 | Delgado et al. | |
| 2014/0158157 A1 | 6/2014 | Kobayashi | |
| 2015/0049323 A1 | 2/2015 | Bal et al. | |
| 2015/0131071 A1* | 5/2015 | Kim | G03F 7/707 355/72 |
| 2015/0168824 A1 | 6/2015 | Sun et al. | |
| 2017/0115580 A1* | 4/2017 | Zhu | G03F 7/70716 |

FOREIGN PATENT DOCUMENTS

| | | |
|---|---|---|
| JP | 5742370 B2 | 7/2015 |
| KR | 10-2011-0068355 A | 6/2011 |
| KR | 10-1405066 B1 | 6/2014 |

* cited by examiner

RETICLE AND EXPOSURE APPARATUS INCLUDING THE SAME

CROSS-REFERENCE TO RELATED APPLICATION

This U.S. non-provisional patent application claims priority under 35 U.S.C. § 119 to Korean Patent Application No. 10-2015-0156920, filed on Nov. 9, 2015, in the Korean Intellectual Property Office, the disclosure of which is hereby incorporated by reference in its entirety.

BACKGROUND

Example embodiments of the inventive concepts relate to equipment of manufacturing a semiconductor device and, more particularly, to reticles and/or an exposure apparatuses including the same.

Highly-integrated semiconductor devices have been developed with the development of information technology. The integration density of semiconductor devices may be greatly affected by a wavelength of a light source of a photolithography process that is employed in a manufacturing process of the semiconductor devices. The light source may be an I-line source, a G-line source, an excimer laser light source (e.g., KrF or ArF), or an extreme ultraviolet (EUV) light source. A wavelength of the EUV light source may be much smaller than that of the excimer laser light source.

SUMMARY

Some example embodiments of the inventive concepts may provide reticles capable of minimizing or mitigating particle contamination and/or exposure apparatuses including the same.

According to an example embodiment, a reticle includes a mask including a mask substrate and mask patterns, the mask patterns on the mask substrate, and an edge cover coupled to an edge of the mask substrate, the edge cover including a floating cover part, the floating cover part spaced apart from the mask patterns, the floating cover part extending from a sidewall of the mask substrate over the mask patterns.

According to an example embodiment, an exposure apparatus includes a source part configured to generate a laser beam, a stage configured to receive a substrate to be exposed to the laser beam, and a reticle between the stage and the light source part, the reticle configured to project the laser beam. The reticle may include a mask having a mask substrate and mask patterns, the mask patterns on the mask substrate, and an edge cover coupled to an edge of the mask substrate, the edge cover having a floating cover part, the floating cover part spaced apart from the mask, the floating cover part extending from a sidewall of the mask substrate over the mask patterns.

According to an example embodiment, an exposure apparatus includes a pumping light source configured to generate pumping light, an illumination part configured to generate EUV plasma using the pumping light, and a projection part configured to project the EUV plasma onto a substrate. The protection part may include a stage configured to receive a substrate, and a reticle configured to transfer an image to the substrate by means of the FIN plasma. The reticle may include a mask including a mask substrate and mask patterns on the mask substrate, and an edge cover coupled to an edge of the mask substrate. The edge cover may include a floating cover part spaced apart from the mask. The floating cover part may extend from a sidewall of the mask substrate over the mask patterns.

According to an example embodiment, an exposure apparatus includes a mask including a mask substrate and mask patterns on the mask substrate, and a cover part at a side of the mask, the cover part covering a side of the mask and an adjoining edge portion of a top surface of the mask, the cover part spaced apart from the mask such that a first air hole is defined between the cover part and the mask.

In some example embodiments, the apparatus may further include an electrostatic chuck configured to receive the mask thereon. The electrostatic chuck may include a plate including an second air hole, the second air hole penetrating the plate from a side surface of the plate to a portion of a top surface of the plate, a chuck electrode in the plate, and buds protruding from the plate, the portion of a top surface of the plate being a portion outside the burls.

BRIEF DESCRIPTION OF THE DRAWINGS

The inventive concepts will become more apparent in view of the attached drawings and accompanying detailed description.

DETAILED DESCRIPTION OF EXAMPLE EMBODIMENTS

Figure 1:
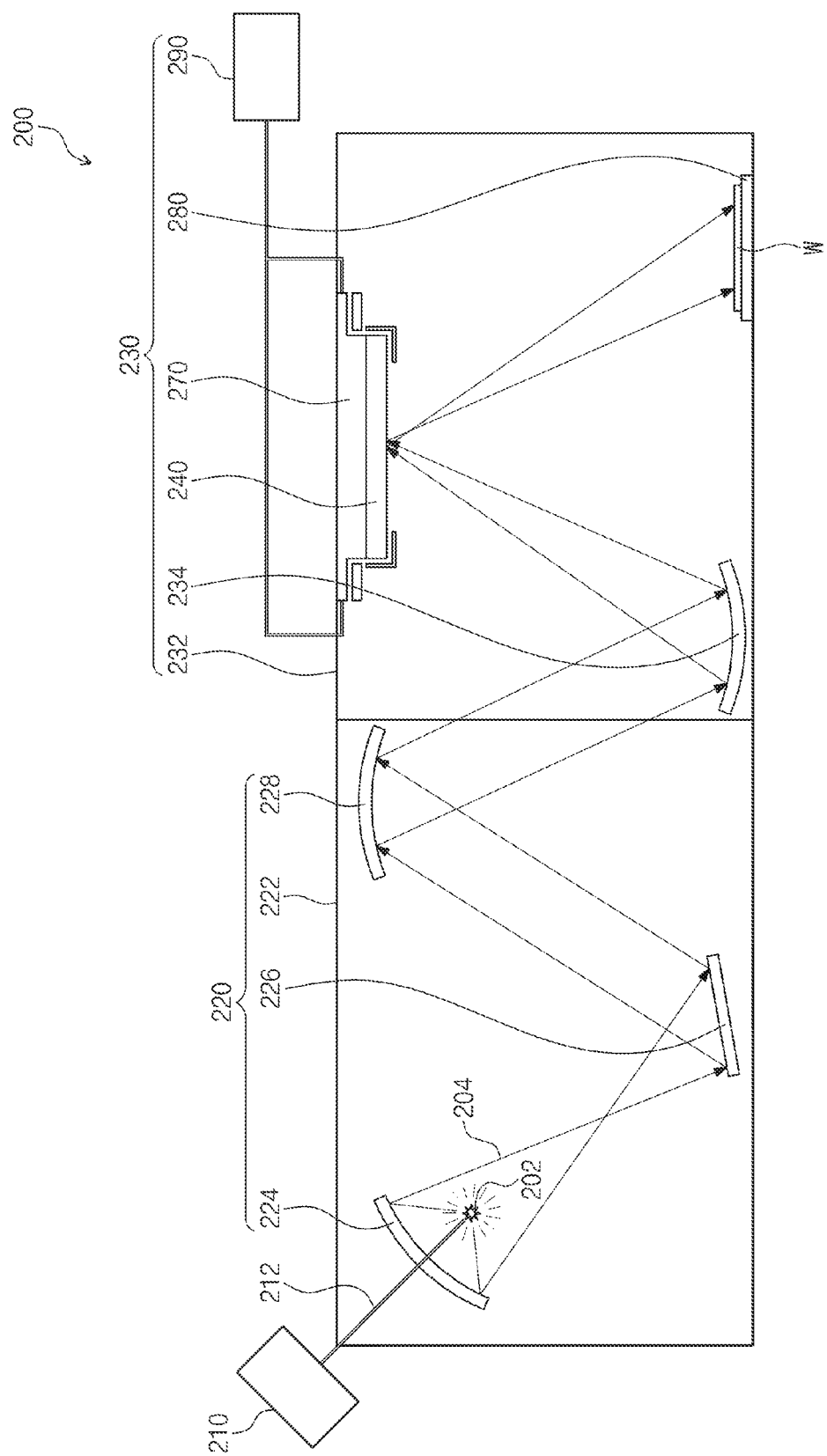
FIG. 1 is a view illustrating an exposure apparatus according to an example embodiment of the inventive concepts.

The inventive concepts will now be described more fully hereinafter with reference to the accompanying drawings, in which some example embodiments of the inventive concepts are shown. The inventive concepts and methods of achieving them be apparent from the following example embodiments that will be described in more detail with reference to the accompanying drawings. Example embodiments of the inventive concept may, however, be embodied in different forms and should not be construed as limited to the example embodiments set forth herein. Rather, these example embodiments are provided so that this disclosure will be thorough and complete, and will fully convey the scope of the inventive concepts to those skilled in the art.

The terminology used herein is for the purpose of describing particular example embodiments only and is not intended to be limiting of example embodiments. As used herein, the singular terms "a," "an," and "the" are intended to include the plural forms as well, unless the context clearly indicates otherwise. It will be understood that when an element is referred to as being "on," "connected to," or "coupled to" another element, it may be "directly on," "directly connected to," or "directly coupled to" the other element or intervening elements may be present.

As used herein, the term "and/or" includes any and all combinations of one or more of the associated listed items.

Expressions such as "at least one of," when preceding a list of elements, modify the entire list of elements and do not modify the individual elements of the list. Thus, for example, both "at least one of A, B, or C" and "A, B, and/or C" means either A, B, C or any combination thereof.

It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Various example embodiments of the present inventive concepts explained and illustrated herein include their complementary counterparts. The same reference numerals or the same reference designators denote the same elements throughout the specification.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

A semiconductor device may be manufactured by a plurality of unit processes. The unit processes may include a photolithography process, a thin layer forming process, an etching process, an ion implantation process, and/or a cleaning process. The photolithography process of the unit processes ia process of forming a mask layer on a substrate. The substrate may be a wafer. The mask layer may be a photoresist pattern. The photolithography process may include a photoresist coating process, a bake process, an exposure process, a post-exposure bake process, and a development process.

The photoresist coating process is a process of coating a substrate with a photoresist. The bake process and the post-exposure bake process are processes of hardening the photoresist with which the substrate is coated. The exposure process is a process of transferring mask patterns of a reticle to the photoresist using light. The reticle may be protected from contamination (e.g., particles) by air during the exposure process. The development process is a process of developing the exposed photoresist to form a photoresist pattern corresponding to the mask pattern.

FIG. 1 illustrates an exposure apparatus 200 according to an example embodiment of the inventive concepts. Referring to FIG. 1, the exposure apparatus 200 may perform the exposure process. In some example embodiments, the exposure apparatus 200 may include an extreme ultraviolet (EUV) exposer. The exposure apparatus 200 may include a pumping light source 210, an illumination part 220, and a projection part 230 including an air supply part 290.

The pumping light source 210 may generate pumping light 212. The pumping light source 210 may provide the pumping light 212 to the illumination part 220. For example, the pumping light 212 may include a laser beam. The pumping light 212 may have, for example, a single wavelength of about 400 nm to about 800 nm.

The illumination part 220 may generate EUV plasma 204. The EUV plasma 204 may be generated from a EUV source 202. The EUV plasma 204 may be defined as EUV light or a EUV laser beam. The EUV plasma 204 may be provided to a substrate W by way of the projection part 230. In some example embodiments, the illumination part 220 may include a source housing 222, a collector mirror 224, a facet field mirror 226, and a facet pupil mirror 228. The source housing 222 may surround the collector mirror 224, the facet field mirror 226, and the facet pupil mirror 228. The source 202 may fill the source housing 222. The pumping light 212 may be transmitted through the source housing 222 and the collector mirror 224. The EUV source 202 may be excited by the pumping light 212. The EUV source 202 may generate the EUV plasma 204. In some example embodiments, the EUV source 202 may include a tin (Sn) or xenon (Xe) gas in a plasma state, titanium (Ti) vapor, or lithium (Li) vapor. The EUV source 202 including tin (Sn) may generate the EUV plasma 204 having a wavelength of about 13.5 nm. The collector mirror 224 may reflect the EUV plasma 204 to the facet field mirror 226. The EUV plasma 204 may be focused on the facet field mirror 226. The facet field mirror 226 may reflect the EUV plasma 204 to the facet pupil mirror 228. The facet field mirror 226 may include, for example, a flat mirror. The EUV plasma 204 may travel in parallel between the facet field mirror 226 and the facet pupil mirror 228. The facet pupil mirror 228 may include, for example, a concave mirror. The facet pupil mirror 228 may focus the EUV plasma 204 on the projection part 230. The EUV plasma 204 may be transmitted through the source housing 222.

The projection part 230 may project the EUV plasma 204 on a substrate W. In some example embodiments, the projection part 230 may include a chamber 232, a condensing mirror 234, a reticle 240, an electrostatic chuck 270, a stage 280, and the air supply part 290. The chamber 232 may be coupled to the source housing 222. In some example embodiments, the chamber 232 may be separated from the source housing 222. The chamber 232 may surround the condensing mirror 234, the reticle 240, the electrostatic chuck 270, and the stage 280. The chamber 232 may protect the condensing mirror 234, the reticle 240, the electrostatic chuck 270, and the stage 280 from particle contamination. The condensing mirror 234 may be disposed in a lower region of an inner space of the chamber 232. The condensing mirror 234 may reflect the EUV plasma 204 to the reticle 240. The reticle 240 may be disposed in an upper region of the inner space of the chamber 232. The reticle 240 may include image patterns 257 of FIG. 2 projected on a substrate W. The image patterns 257 may be transferred to the substrate W. A size of the image pattern 257 may be greater than that of a target pattern. For example, the size of the image pattern 257 may be about four or more times greater than that of the target pattern. The electrostatic chuck 270 may be disposed on a ceiling of the inner space of the chamber 232 to hold the reticle 240 thereon. The electrostatic chuck 270 may hold the reticle 240 by electrostatic force of the Johnson-Rahbec effect. The stage 280 may be disposed in the lower region of the inner space of the chamber 232. The stage 280 may receive the substrate W.

The air supply part 290 may be connected to the projection part 230. For example, the air supply part 290 may be connected to the electrostatic chuck 270 disposed in the chamber 232. The air supply part 290 may supply air 10 to the reticle 240 through the electrostatic chuck 270. The air 10 may mitigate or prevent particle contamination of the reticle 240.

Figure 2:
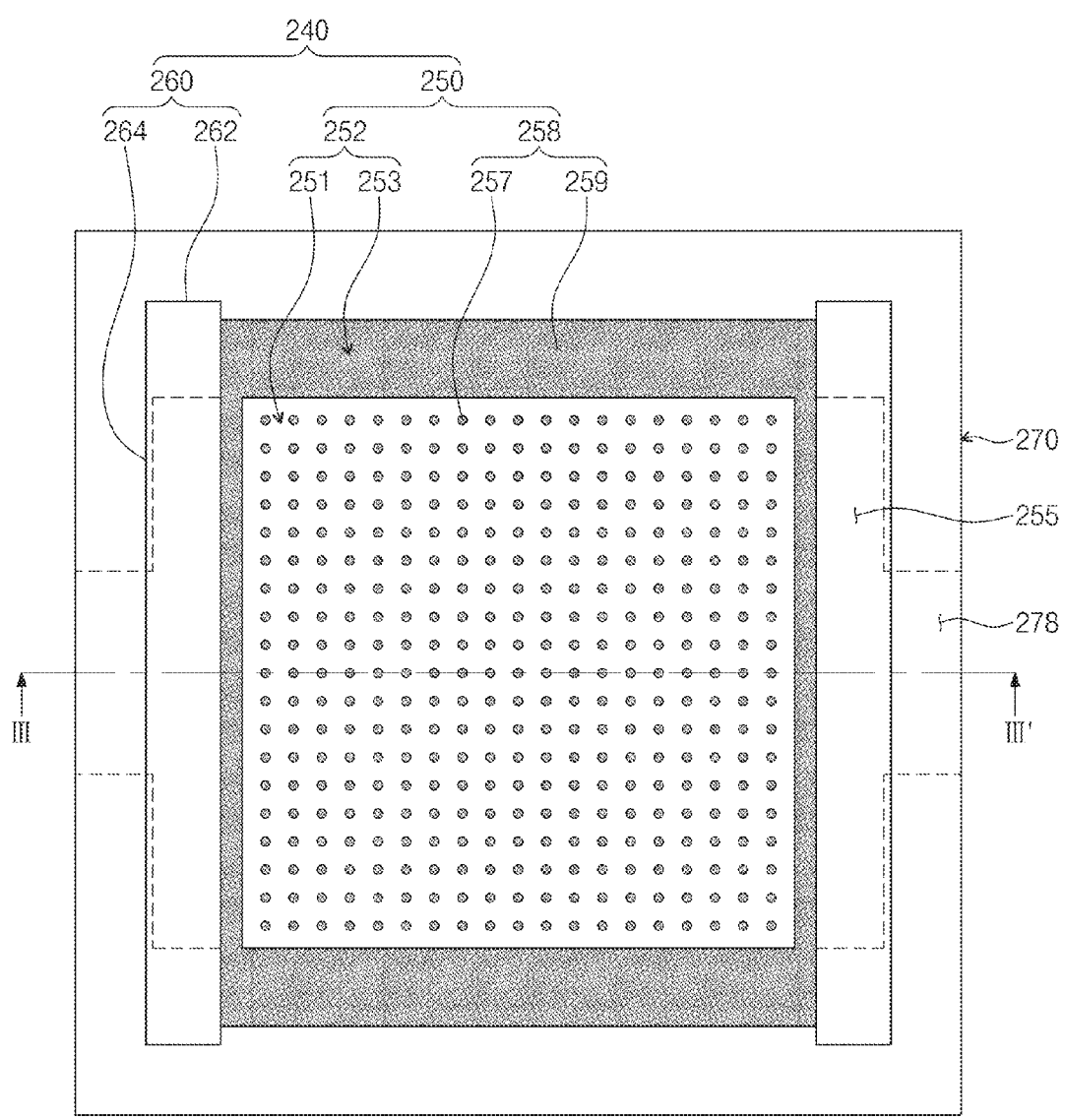
FIG. 2 is a plan view illustrating an example embodiment of a reticle and an electrostatic chuck of FIG. 1.
Figure 3:
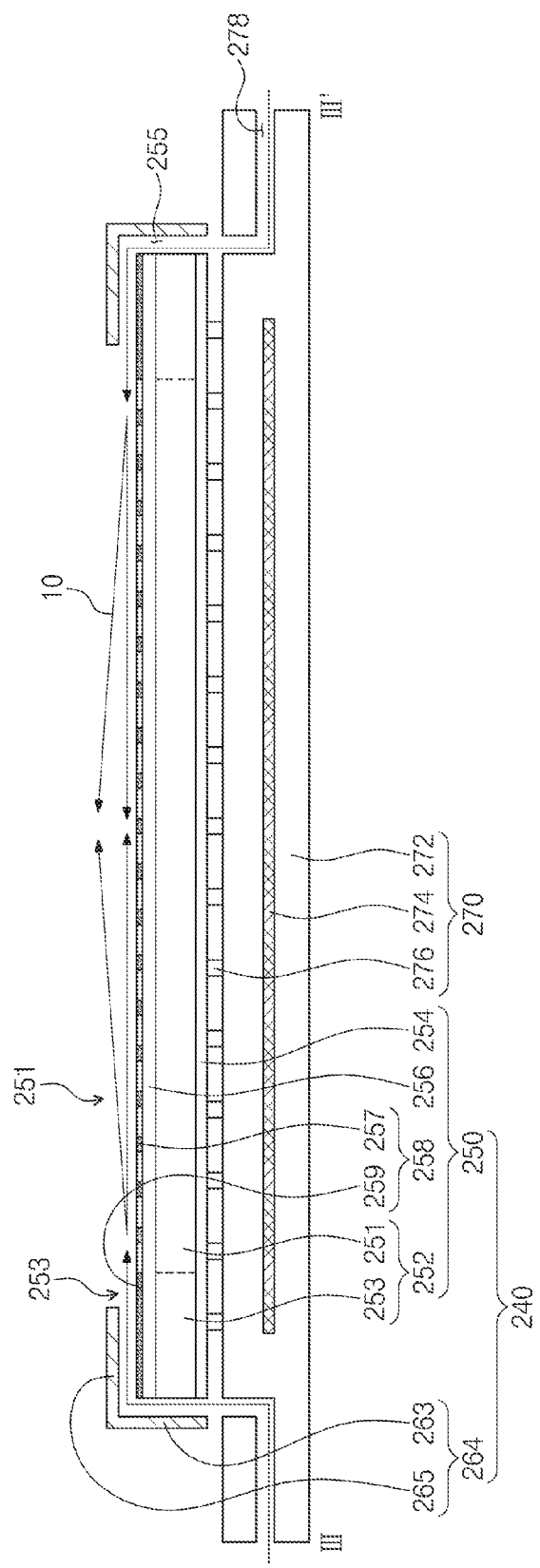
FIG. 3 is a cross-sectional view taken along line III-III' of FIG. 2.
Figure 4:
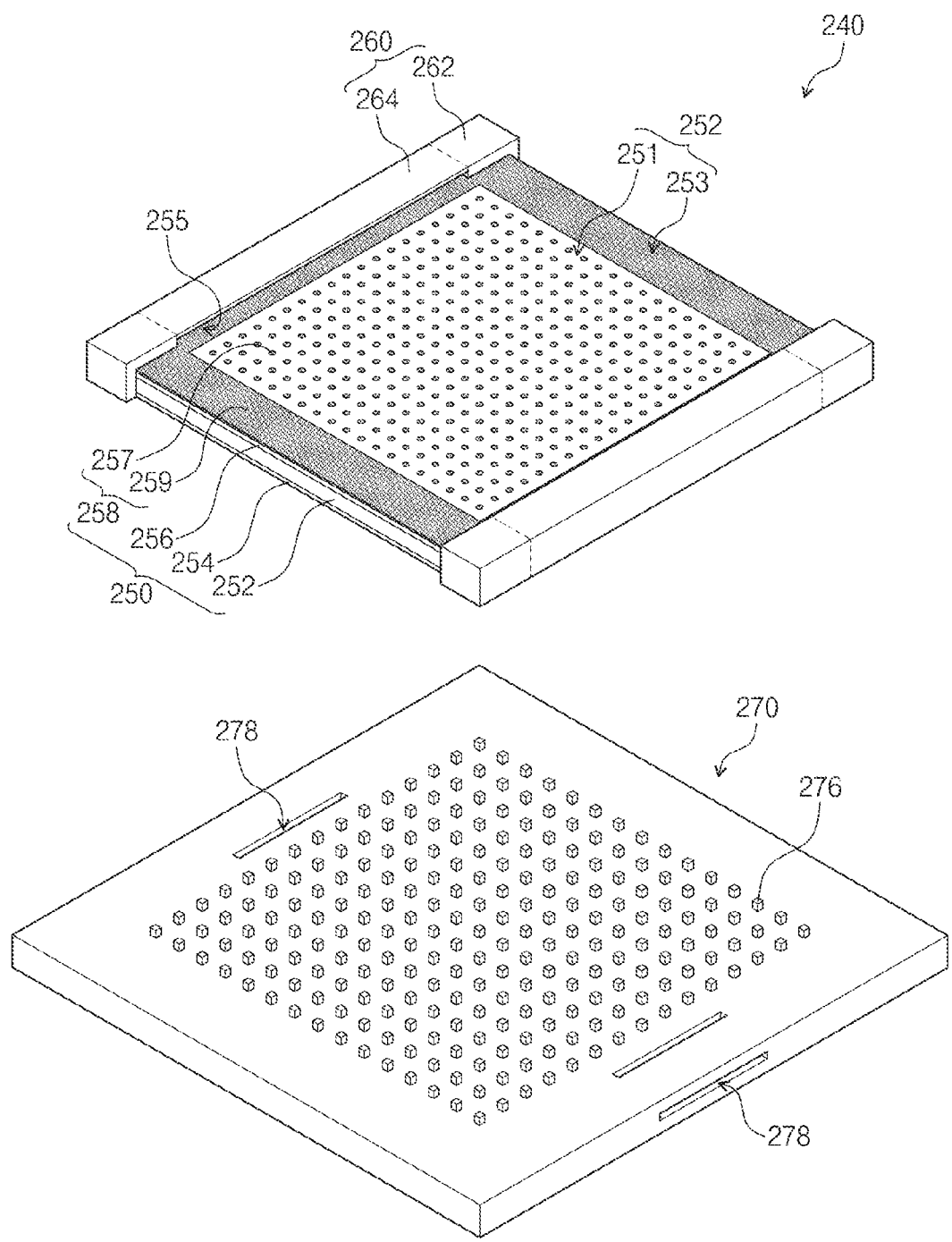
FIG. 4 is an exploded perspective view illustrating the reticle and the electrostatic chuck of FIG.

FIG. 2 is a plan view illustrating an example embodiment of the reticle 240 and the electrostatic chuck 270 of FIG. 1. FIG. 3 is a cross-sectional view taken along line II-II' of FIG. 2. FIG. 4 is an exploded perspective view illustrating the reticle 240 and the electrostatic chuck 270 of FIG. 2.

Referring to FIGS. 2 and 3, the reticle 240 may be disposed on the electrostatic chuck 270. In some example embodiments, the reticle 240 may be held or fixed under the electrostatic chuck 270. For example, the reticle 240 and the electrostatic chuck 270 may have square shapes. The electrostatic chuck 270 may be greater than the reticle 240. In some example embodiments, the reticle 240 may include a mask unit 250 and edge cover units 260.

The mask unit 250 may be disposed on a central portion of the electrostatic chuck 270. For example, the mask unit 250 may have the square shape of which each side has a length of for example, about 152.4 mm. In some example embodiments, the mask unit 250 may include a mask substrate 252, a metal layer 254, a reflection layer 256, and mask patterns 258. The mask substrate 252 may include low thermal expansion material (LTEM). The metal layer 254 may be disposed under of the mask substrate 252. For example, the metal layer 254 may be disposed on a first surface of the mask substrate which is adjacent to the electrostatic chuck 270. When a positive voltage is applied to a chuck electrode 274, the metal layer 254 may be charged with negative charges. Alternatively, when a negative voltage is applied to the chuck electrode 274, the metal layer 254 may be charged with positive charges. The reflection layer 256 may be disposed on the mask substrate 252. For example, the reflection layer 256 may be disposed on a second surface of the mask substrate 252, which is opposite to the first surface. The reflection layer 256 may reflect the EUV plasma 204. In some example embodiments, the reflection layer 256 may include molybdenum layers and silicon layers. The molybdenum layers and the silicon layers may be alternately stacked. Each of the molybdenum layers and the silicon layers may have a thickness equal to a half of the wavelength of the EUV plasma 204. For example, each of the molybdenum layers and the silicon layers may have a thickness of about 7 nm. The mask patterns 258 may be disposed on the reflection layer 256. The mask patterns 258 may absorb the EUV plasma 204. In some example embodiments, the mask patterns 258 may include the image patterns 257 and black patterns 259. The image patterns 257 may be disposed on a central portion of the mask substrate 252. The image patterns 257 may be patterns to be transferred to a substrate W. The black patterns 259 may be disposed on an edge portion of the mask substrate 252.

In some example embodiments, the mask substrate 252 may include an image region 251 and a black region 253. The image region 251 may be disposed at a central portion of the mask unit 250. The image region 251 may be a region through which the EUV plasma 204 is projected. The image patterns 257 may be disposed on the image region 251. For example, the image region 251 may have a square shape of which each side has a length of, for example, about 101.6 mm.

The black region 253 may be disposed around the image region 251. The black region 253 may be a region absorbing the EUV plasma 204. The black patterns 259 may be disposed on the black region 253. The black region 253 may have a square ring shape having a width of, for example, about 25.4 mm.

The edge cover units 260 may be respectively disposed on both sides of the mask unit 250 opposite to each other. The edge cover units 260 may be disposed on the black region 253. Each of the edge cover units 260 may include fixing cover parts 262 and a floating cover part 264. The fixing cover parts 262 may be disposed on both corners of the mask unit 250. The floating cover part 264 may be connected between the fixing cover parts 262. The floating cover parts 264 of the edge cover units 260 may have first air holes 255, respectively. The floating cover parts 264 and the first air holes 255 may be aligned with the image region 251. Lengths of the floating cover parts 264 may be equal to those of the first air holes 255. For example, the lengths of the floating cover parts 264 may be equal to the length of one side of the image region 251. For example, each of the floating cover parts 264 may have the length of, for example, 152.4 mm.

The electrostatic chuck 270 may have second air holes 278. The first air holes 255 may be aligned on the second air holes 278, respectively. The second air hole 278 may be smaller than the first air hole 255. In some example embodiments, a size of the second air hole 278 may be equal to that of the first air hole 255.

Referring to FIGS. 3 and 4, the electrostatic chuck 270 may include a plate 272, a chuck electrode 274, and burls 276. The plate 272 may include an insulating material. For example, the plate 272 may include a ceramic or a dielectric. The chuck electrode 274 may be disposed in the plate 272. The chuck electrode 274 may have the same size as the mask unit 250. The burls 276 may have island shapes on the plate 272. The hurls 276 may be disposed between the plate 272 and the mask substrate 252. The second air hole 278 may extend from a sidewall of the plate 272 onto a top surface of the plate 272 adjacent to the burls 276. In some example embodiments, the second air hole 278 may extend from a bottom surface of the plate 272 onto the top surface of the plate 272. In some other example embodiments, the second air hole 278 may be defined through the plate 272 and include a first portion parallel to the top and bottom surface of the plate 272 and a second portion perpendicular to the top and bottom surface of the plate 272. The first portion may extend from a side surface of the plate 272, and the second portion may extend from an end of the first portion to the top surface of the plate 272 that is adjacent to the burls 276.

When a constant voltage is applied to the chuck electrode 274, the mask substrate 252 may be held or fixed on the burls 276. The second air hole 278 may be spaced apart from the first air hole 255 by a height of the burls 276. When the air 10 is provided into the second air holes 278, the air 10 may be transmitted into the first air holes 255. In some example embodiments, the air 10 between the first and second air holes 255 and 278 may be partially provided into between the plate 272 and the mask unit 250. As stated above, the mask unit 250 may reflect the EUV plasma 204. The mask unit 250 may be heated while reflecting the EUV plasma 204 because the mask unit 250 absorbs about 20% of the EUV plasma 204. The air 10 provided between the plate 272 and the mask unit 250 may cool the mask unit 250.

In some example embodiments, the mask unit 250 may include the mask substrate 252, the metal layer 254, the reflection layer 256, and the mask patterns 258. The mask substrate 252 may include the low thermal expansion material (LTEM). The metal layer 254 may be disposed under the mask substrate 252. When a positive voltage is applied to the chuck electrode 274, the metal layer 254 may be charged with negative charges. Alternatively, when a negative voltage is applied to the chuck electrode 274, the metal layer 254 may be charged with positive charges. The reflection layer 256 may be disposed on the mask substrate 252. The reflection layer 256 may reflect the EUV plasma 204. In some example embodiments, the reflection layer 256 may include molybdenum layers and silicon layers. The molybdenum layers and the silicon layers may be alternately stacked. Each of the molybdenum layers and the silicon layers may have the thickness equal to the half of the wavelength of the EUV plasma 204. For example, each of the molybdenum layers and the silicon layers may have a thickness of about 7 nm. The mask patterns 258 may be disposed on the reflection layer 256. The mask patterns 258 may absorb the EUV plasma 204. In some example embodiments, the mask patterns 258 may include the image patterns 257 and the black patterns 259. The image patterns 257 may be disposed on the central portion of the mask substrate 252. The image patterns 257 may be disposed on the image region 251. The image patterns 257 may be patterns to be transferred to a substrate W. The black patterns 259 may be disposed on the edge portion of the mask substrate 252. The black patterns 259 may be disposed on the black region 253.

The fixing cover parts 262 may be attached to or fixed on the sidewalls of the mask substrate 252. The fixing cover parts 262 may be attached to or fixed on the black patterns 259. In some example embodiments, the fixing cover parts 262 may be attached to or fixed on the top surface of the mask substrate 252.

The floating cover parts 264 may be disposed on the black patterns 259. The first air holes 255 may be formed between the mask unit 250 and the floating cover parts 264. The first air holes 255 may be disposed to be opposite to each other. The air 10 may be provided toward a center of the image region 251 through the first air holes 255. The air 10 may be provided onto the image patterns 257 and the reflection layer 256. Thus, it is possible to mitigate or prevent particle contamination of the image patterns 257 and/or the reflection layer 256.

The floating cover parts 264 may provide the air 10 onto the black patterns 259. In example embodiments, each of the floating cover parts 264 may include first and second floating cover sub parts 263 and 265. The first floating cover sub parts 263 may be disposed on the sidewalls of the mask substrate 252. The second floating cover sub parts 265 may be connected to top ends of the first floating cover sub parts 263, respectively. The second floating cover sub parts 265 may be disposed on the black patterns 259. The second floating cover sub parts 265 may extend from the sidewalls of the mask substrate 252 over the top surface of the mask substrate 252 to cover a black region 253 (but not cover the image region 251) of the mask substrate 252.

Figure 5:
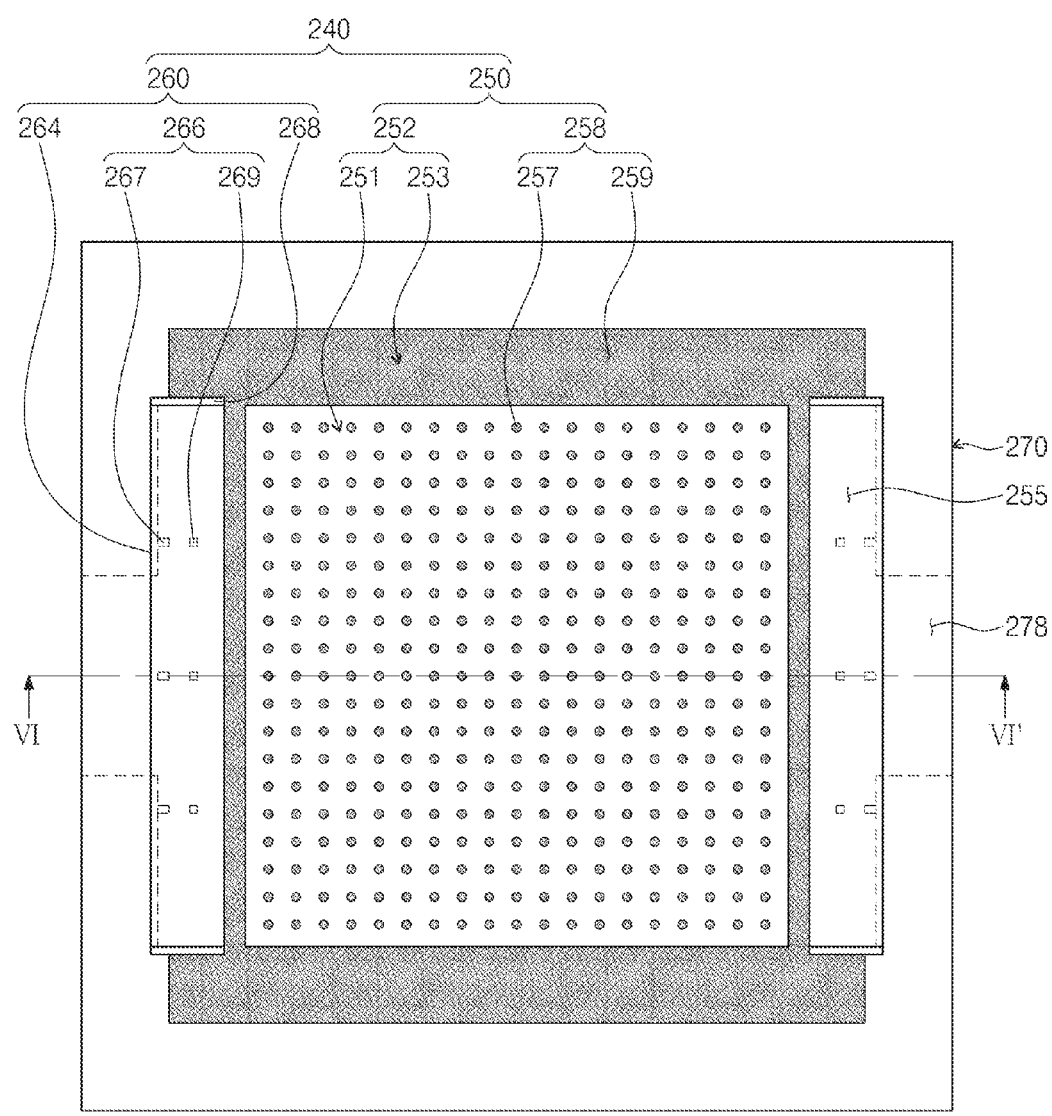
FIG. 5 is a plan view illustrating an example embodiment of a reticle and an electrostatic chuck of FIG. 1.

FIG. 5 is a plan view illustrating an example embodiment of the reticle 240 and the electrostatic chuck 270 of FIG. 1. Edge cover units 260 of the reticle 240 may include floating cover parts 264, columns 266, and side blocks 268. The floating cover parts 264 may be disposed on both edges of the mask unit 250 and the electrostatic chuck 270. The image region 251 may be disposed between the floating cover parts 264. The floating cover parts 264 and the image region 251 may be aligned with each other and may have the same length. The columns 266 may be disposed under the floating cover parts 264. For example, the columns 266 may be disposed between the mask unit 250 and the floating cover parts 264. The side blocks 268 may be connected to both edges of each of the floating cover parts 264. The first air hole 55 may be defined between the side blocks 268.

The electrostatic chuck 270 may be the same as described with reference to FIGS. 3 and 4.

Figure 6:
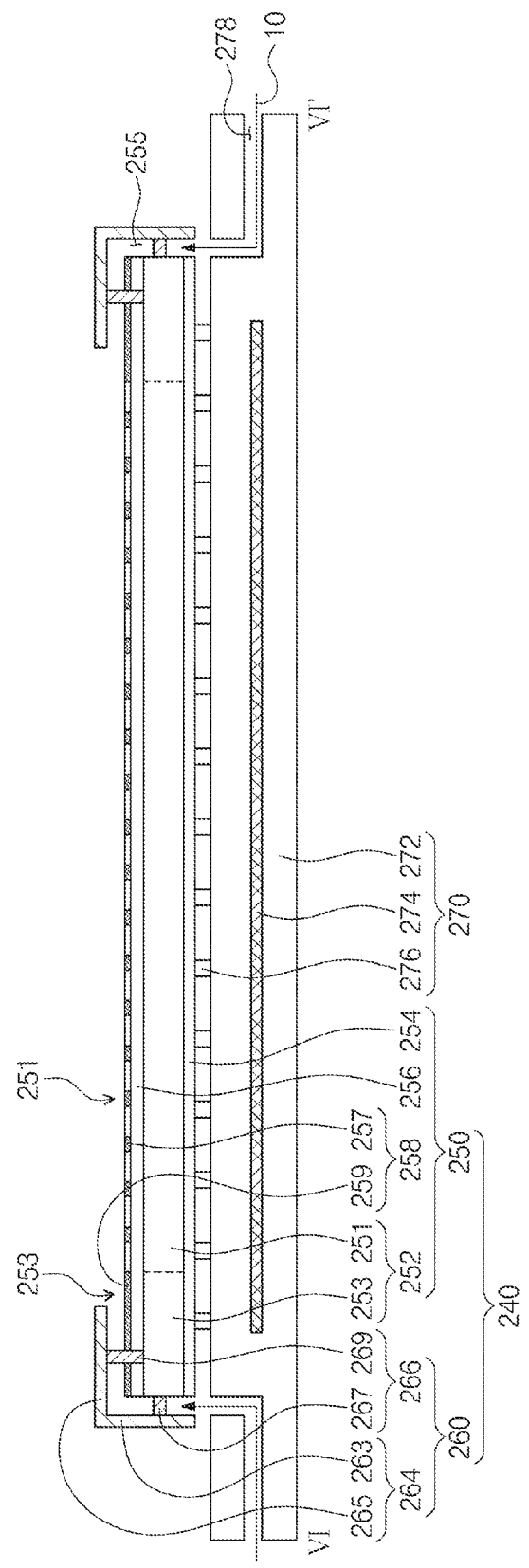
FIG. 6 is a cross-sectional view taken along line VI-VI' of FIG. 5.

FIG. 6 is a cross-sectional view taken along line VI-VI' of FIG. 5. Each of the floating cover parts 264 may include a first floating cover sub part 263 and a second floating cover sub part 265. The first floating cover sub part 263 may be disposed on the sidewall of the mask substrate 252. The second floating cover sub part 265 may be connected to the first floating cover sub part 263. The second floating cover sub part 265 may be disposed on the black patterns 259.

The columns 266 may be disposed between the mask unit 252 and the floating cover part 264. The columns 266 may be disposed in the first air holes 255. The columns 266 may attach or fix the floating cover part 264 to the mask substrate 252. In some example embodiments, the columns 266 may include first set of columns 267 and second set of columns 269. The first set of columns 267 may be disposed between the first floating cover sub part 263 and the sidewall of the mask substrate 252. The second set of columns 269 may be disposed between the second floating cover sub part 265 and the top surface of the mask substrate 252.

The mask unit 250 of the reticle 240 and the electrostatic chuck 270 may be the same as described with reference to FIGS. 2, 3, and 4.

Figure 7:
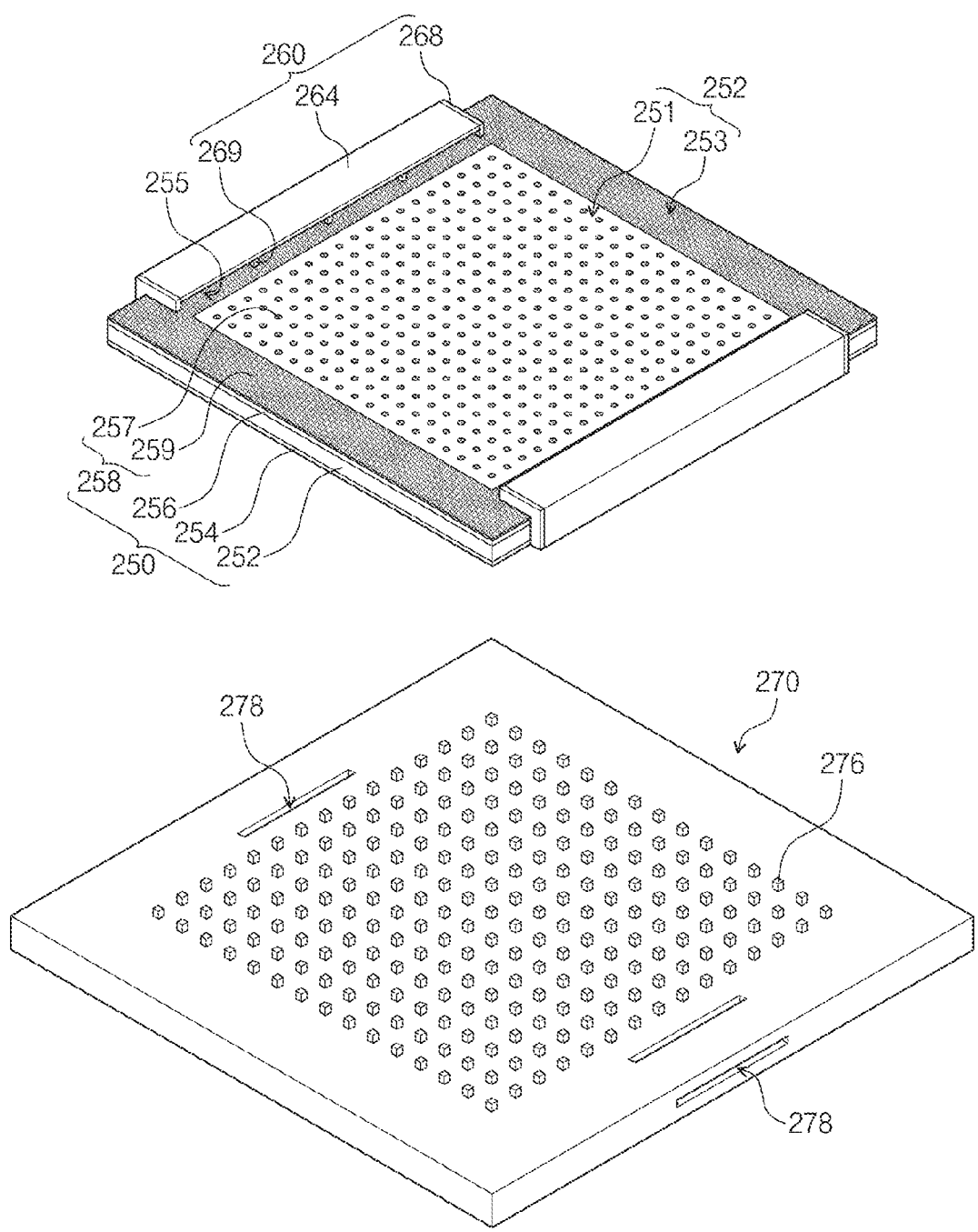
FIG. 7 is an exploded perspective view illustrating the reticle and the electrostatic chuck of FIG. 5.

FIG. 7 is an exploded perspective view illustrating the reticle 240 and the electrostatic chuck 270 of FIG. 5.

Referring to FIG. 7, the side blocks 268 may be disposed at both edges of each of the floating cover parts 264. The second set of columns 269 may be disposed between the side blocks 268. The first air holes 255 may be defined by the mask unit 250, the floating cover parts 264, and the side blocks 268.

The mask unit 250 and the electrostatic chuck 270 may be the same as described with reference to FIGS. 2, 3, and 4.

As described above, the reticle according to some example embodiments of the inventive concepts may include an edge cover unit which is coupled to an edge of the mask substrate to provide an air hole. Air may be provided on the mask patterns of the mask substrate through the air hole. The air may prevent particle contamination on the mask substrate and the mask patterns.

While the inventive concepts have been described with reference to example embodiments, it will be apparent to those skilled in the art that various changes and modifications may be made without departing from the spirits and scopes of the inventive concepts. Therefore, it should be understood that the above example embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A reticle comprising:
a mask including a mask substrate and mask patterns; the mask patterns on a central region of the mask substrate; and
a first edge cover and a second edge covers coupled to opposite edges of the mask substrate, respectively, the first and second edge covers including a first floating cover part and a second floating cover part, respectively, the first and second floating cover parts spaced apart from the mask to form a first air hole between the mask and the first floating cover part and a second air hole between the mask and the second floating cover part, each of the first and second floating cover parts extending from a corresponding one of opposite sidewalls of the mask substrate over a corresponding edge portion on the mask substrate,
wherein the mask patterns are disposed between the first and second holes, and the first and second floating cover parts expose the mask patterns on the central region of the mask substrate.

2. The reticle of claim 1, wherein each of the first and second edge covers further includes a first fixing cover part and a second cover fixing part, respectively, the first and second fixing cover parts of a corresponding one of the first and second edge covers connected to opposite edges of the corresponding one of the first and second floating cover parts, the first and second fixing cover parts of each of the first and second edge covers attached on opposite edges of a corresponding side of the mask substrate.

3. The reticle of claim 1, wherein the mask substrate comprises:
an image region aligned with the first and second floating cover parts; and
a black region surrounding the image region.

4. The reticle of claim 3, wherein the first and second edge covers are on the black region.

5. The reticle of claim 3, wherein each of the first and second floating cover parts comprises:
a first floating cover sub part parallel to a corresponding one of the opposite sidewalls of the mask substrate; and
a second floating cover sub part extending from the first floating cover sub part, the second floating cover sub part parallel to a top surface of the mask substrate.

6. The reticle of claim 5, wherein the second floating cover sub part is on the black region.

7. The reticle of claim 1, wherein each of the first and second edge covers further comprises:
columns between a corresponding one of the first and second floating cover parts and the mask substrate, the columns attaching the corresponding one of floating first and second cover parts to the mask substrate.

8. The reticle of claim 7, wherein the columns included in each of the first and second edge covers comprise:
a plurality of first columns between a corresponding one of the opposite sidewalls of the mask substrate and a corresponding one of the first and second floating cover parts; and
a plurality of second columns between a top surface of the mask substrate and the corresponding one of the first and second floating cover parts.

9. The reticle of claim 8, wherein the mask substrate comprises:
an image region; and
a black region surrounding the image region, the plurality of second columns of the columns included in each of the first and second edge covers being on the black region.

10. The reticle of claim 7, wherein each of the first and second edge covers further comprises side blocks, the side blocks connected to both edges of a corresponding one of the first and second floating cover parts, and the columns included in a corresponding one of the first and second edge covers are between the side blocks.

11. An exposure apparatus comprising:
a light source configured to generate a laser beam;
a stage configured to receive a substrate to be exposed to the laser beam; and
a reticle between the stage and the light source, the reticle configured to project the laser beam, the reticle including,
a mask having a mask substrate and mask patterns, the mask patterns on a central region of a top surface of the mask substrate; and
a first edge cover and a second edge cover coupled to opposite edges of the mask substrate, respectively, the first and second edge covers having a first floating cover part and a second floating cover part, respectively, the first and second floating cover parts spaced apart from the mask to form a first air hole between the mask and the first floating cover part and a second air hole between the mask and the second floating cover part, the first and second floating cover parts extending from a corresponding one of opposite sidewalls of the mask substrate over a corresponding edge portion on the top surface of the mask substrate,
wherein the mask patterns are disposed between the first and second holes, and the first and second floating cover parts expose the mask patterns on the central region of the top surface of the mask substrate.

12. The exposure apparatus of claim 11, further comprising:
an electrostatic chuck configured to receive the reticle thereon, the electrostatic chuck including a third air hole aligned with the first and second air holes.

13. The exposure apparatus of claim 12, wherein the electrostatic chuck comprises:
a plate;
a chuck electrode in the plate, the chuck electrode being parallel to the mask substrate; and
burls on the plate,
wherein the third air hole extends from a sidewall of the plate onto a portion of a top surface of the plate, the portion being adjacent to the burls.

14. The exposure apparatus of claim 13, wherein the mask further comprises a metal layer on a bottom surface of the mask substrate, the metal layer facing the burls.

15. The exposure apparatus of claim 11, wherein the mask further comprises:
a reflection layer on the mask substrate and under the mask patterns, the reflection layer configured to reflect the laser beam to the substrate.

16. An exposure apparatus comprising:
a mask including a mask substrate and mask patterns on a central region of the mask substrate; and
a first cover part and a second cover part at opposite sides of the mask, the first and second cover parts covering opposite sidewalls of the mask, respectively, and adjoining edge portions of a top surface of the mask, respectively, the first and second cover parts spaced apart from the mask such that a first air hole and a second air hole are defined between the mask and the first cover part and the mask and the second cover part, respectively, wherein the mask patterns are disposed between the first and second holes, and the first and second cover parts expose the mask patterns on the central region of the mask substrate.

17. The exposure apparatus of claim 16, further comprising:
an electrostatic chuck configured to receive the mask thereon, the electrostatic chuck including,
a plate including a third air hole, the third air hole penetrating the plate from a side surface of the plate to a portion of a top surface of the plate,
a chuck electrode in the plate, and
burls protruding from the plate, the portion of the top surface of the plate being a portion outside an area defined by the burls.

18. The exposure apparatus of claim 17, wherein one end of the third air hole and one end of a corresponding one of the first and second air holes are aligned to each other.

19. The exposure apparatus of claim 16, wherein the mask substrate includes an image region aligned with the first and second cover parts and a black region outside the image region, and one of the adjoining edge portions of the top surface of the mask covered by a corresponding one of the first and second cover part corresponds to the black region.

20. The exposure apparatus of claim 16, wherein the mask further includes a metal layer on a bottom surface thereof.

* * * * *